United States Patent [19]

Hwang et al.

[11] Patent Number: 4,649,347

[45] Date of Patent: Mar. 10, 1987

[54] METHOD FOR OFF-CENTER FIELD-OF-VIEW IMAGING USING MR

[75] Inventors: Tzong Y. Hwang, Naperville, Ill.; Nicholas F. Campagna, Milwaukee, Wis.

[73] Assignee: General Electric Company, Milwaukee, Wis.

[21] Appl. No.: 798,546

[22] Filed: Nov. 15, 1985

[51] Int. Cl.$^4$ ............................................. G01R 33/20
[52] U.S. Cl. .................................... 324/309; 324/310
[58] Field of Search ............... 324/307, 309, 310, 314, 324/311

[56] References Cited

U.S. PATENT DOCUMENTS 4,015,196  3/1977  Moore et al. ..................... 324/309
4,471,306  9/1984  Edelstein et al. ................. 324/309

Primary Examiner—Stewart J. Levy
Assistant Examiner—Kevin D. O'Shea
Attorney, Agent, or Firm—Alexander M. Gerasimow; Douglas E. Stoner

[57] ABSTRACT

Off-center field-of-view studies are achieved in MR multi-slice imaging methods by rotation of the axes along which the phase-encoding and readout magnetic field gradients are applied and offsetting the frequency of the MR receiver from the system isocenter frequency. The method is particularly useful in two-dimensional multi-slice imaging using surface coils.

2 Claims, 4 Drawing Figures

METHOD FOR OFF-CENTER FIELD-OF-VIEW IMAGING USING MR

BACKGROUND OF THE INVENTION

This invention relates to magnetic resonance (MR) methods. More specifically, this invention relates to an off-center field-of-view (FOV) technique for MR imaging.

The magnetic resonance phenomenon has been utilized in the past in high resolution magnetic resonance spectroscopy instruments by structural chemists to analyze the structure of chemical compositions. More recently, MR has been developed as a medical diagnostic modality having applications in imaging the anatomy, as well as in performing in-vivo, noninvasive spectroscopic analyses. As is now well known, the MR phenomenon can be excited within a sample object, such as a human patient, positioned in a homogeneous polarizing magnetic field, by irradiating the object with radio-frequency (RF) energy at the Larmor frequency. In medical diagnostic applications, this is typically accomplished by positioning the patient to be examined in the field of an RF coil having usually a cylindrical geometry, and energizing the RF coil within an RF power amplifier. Upon cessation of the RF excitation, the same or a different coil, such as a surface coil, is used to detect the MR signals emanating from the patient volume lying within the field of the RF coil. In the course of a complete MR scan, a plurality of MR signals are typically observed. The signals are used to derive MR imaging or spectroscopic information about the object studied.

In typical studies, the MR signal is usually observed in the presence of pulsed linear magnetic field gradients used to encode spatial information into the signal. Pulsed magnetic field gradients are also employed with selective RF pulses to excite nuclear spins in predetermined regions of the object undergoing examination. In the course of an MR examination, it is frequently desirable to apply pulsed magnetic field gradients, designated $G_x$, $G_y$ and $G_z$, in each of the x, y, and z directions, respectively, of a conventional Cartesian coordinate system. In practice, the direction in which the magnetic field gradient pulses may be applied is not limited in any manner, and any direction could be selected as required.

In conducting an MR imaging study, the patient region of interest must be positioned in the polarizing field and centered about a system isocenter where the magnetic field produced by the magnet is most homogeneous. This is accomplished by using a patient support device capable of bidirectional longitudinal travel into and out of the magnet bore, but which generally is not capable of travel in the transverse or vertical directions within the bore. In some MR imaging situations, it is necessary to apply off-center FOV techniques to select the image object regions which are situated away from the system isocenter. The off-center FOV techniques are used because of limitations on displacing the object studied in the transverse or vertical directions within the bore of the magnet. Therefore, these techniques ease the positioning constraints by allowing the imaged region to be centered at the anatomy of clinical interest, rather than requiring the anatomy to be repositioned at the isocenter. This capability is especially valuable for surface coil imaging, where most of the imaged regions are located near the outer surface of the patient and are displaced relative to the slice-selection axis.

In two-dimensional Fourier transform MR imaging, the three orthogonal gradients identify the three functional imaging axes: The slice-select axis (typically the z axis), the read-out axis (typically the x axis), and the phase-encoding axis (the y axis). Since in general the system isocenter is defined by the point where the three orthogonal magnetic field gradients intersect and have zero amplitude, the off-center FOV techniques can be conveniently classified using the x, y and z axes as references. An offset in the direction of an axis perpendicular to the plane of the image slice (z-axis offset) can be achieved by applying a gradient along that axis along with a frequency selective RF excitation pulse. Only the slice with Larmor frequencies within the range of frequencies contained in the RF excitation pulse will be excited and thus selected for imaging. Other slices offset from the slice centered at the isocenter can be easily excited by appropriately modulating the RF excitation pulse. The offset in the direction of the readout axis (typically the x axis) is relatively easily achieved because the readout axis is frequency encoded by the application of a linear readout gradient. The field of view in the direction of the readout axis corresponds to an encoding frequency band centered at the receiver frequency. Thus, the off-center field of view may be obtained by offsetting the receiver frequency from the isocenter frequency along this axis; that is, the center of the RF excitation pulse frequency. An offset in the phase-encoding direction (typically the y axis) may be accomplished by using selective 180° RF excitation pulses along with a gradient applied in the phase-encoding direction. Such a technique is disclosed in commonly assigned pending application Ser No. 555,097, which is incorporated herein by reference. In a manner similar to that described above with reference to slice selection, the amplitude of the gradient is matched with the frequency of the 180° RF pulse to obtain the desired field of view. The center of the RF pulse thus corresponds to the center of the field of view. By offsetting the center frequency of the RF pulse, the off-center field of view along the phase-encoding axis is obtained. Since this technique requires the 180° RF excitation pulses to be uniquely selective in the direction of the phase-encoding axis, it precludes the use of selective 180° RF pulses for other applications, such as, for example, two-dimensional multi-slice imaging.

It is therefore a principal object of the present invention to provide a method for obtaining off-center field-of-view images, while preserving the availability of the selective 180° RF pulses for use in multi-slice MR imaging or other applications requiring such selective RF pulses.

SUMMARY OF THE INVENTION

A method is provided for imaging, using MR, a predetermined region of an object, where the region is removed from the isocenter of an MR system. The MR system is provided with gradient coils for generating magnetic field gradients along the x, y and z axes of a Cartesian coordinate system and RF means for exciting and receiving MR signals from the region. The method includes the steps of: (a) Exciting nuclear spins in the region; (b) applying a phase-encoding gradient having one of a plurality of predetermined amplitudes to phase encode spatial information into the excited nuclear spins, the phase-encoding gradient being applied along a y' axis rotated by an angle $\theta$ relative to the y axis; (c) receiving an MR signal from the excited spins in the presence of a readout magnetic field gradient applied along an x' axis which is orthogonal to said y' axis, the angle $\theta$ being greater than zero and selected such that the x' axis intersects the predetermined region; and (d) repeating the steps (a)–(c) so as to sequence through each of the plurality of predetermined amplitudes.

BRIEF DESCRIPTON OF THE DRAWINGS

The features of the invention believed to be novel are set forth with particularity in the appended claims. The invention itself, however, both as to its organization and method of operation, together with further objects and advantages thereof, may best be understood by reference to the following description taken in conjunction with the accompanying drawings in which:

DETAILED DESCRIPTION OF THE INVENTION

Figure 1:
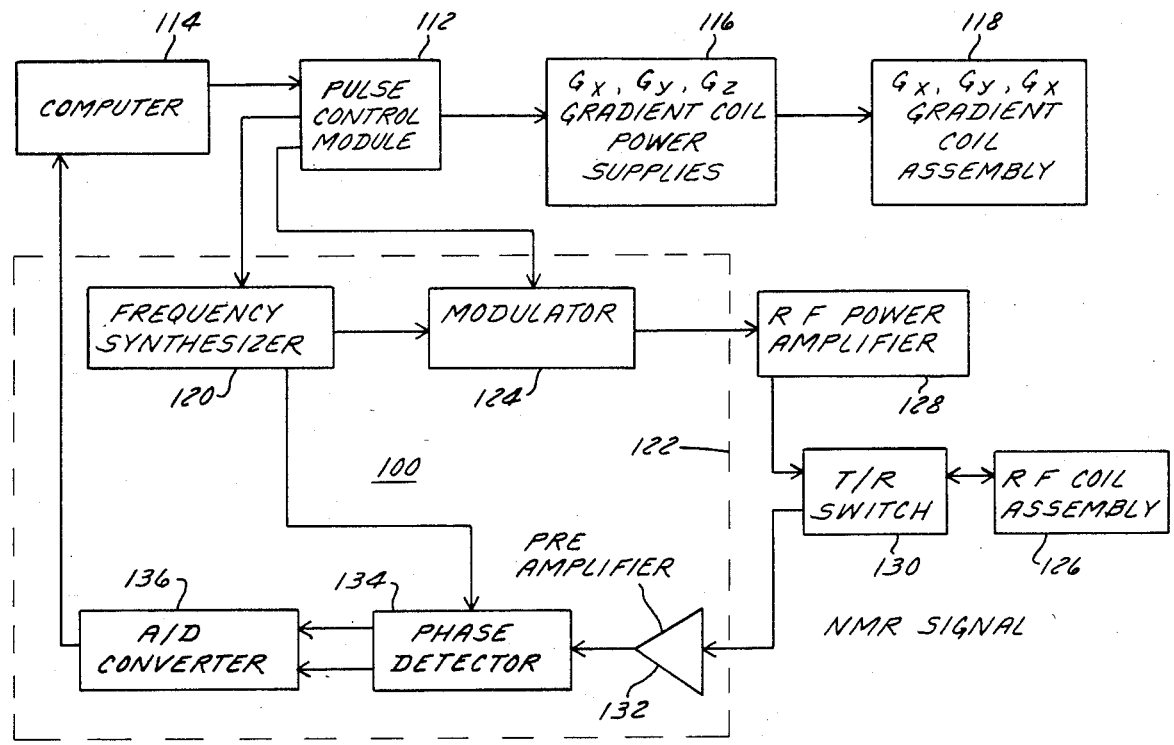
FIG. 1 depicts in block schematic form an exemplary MR system useful in practicing the invention.

FIG. 1 is a simplified block diagram of an MR imaging system with respect to which the preferred embodiment of the invention will be disclosed. It will be recognized, however, that the invention as claimed may be advantageously practiced with any suitable apparatus. The system, generally designated 100, includes a pulse control module 112 which provides properly timed pulse waveform signals, under the control of a host computer 114, to magnetic field gradient power supplies collectively designated 116 which energize gradient coils forming part of a gradient coil assembly generally indicated by a block 118. The assembly contains coils which, when energized by the power supplies, produce the $G_x$, $G_y$, and $G_z$ magnetic field gradients directed in the x, y and z directions, respectively, of the Cartesian coordinate system. The use of the $G_x$, $G_y$ and $G_z$ gradients in MR imaging applications will be described hereinafter with reference to FIG. 2.

Continuing with reference to FIG. 1, the pulse control module provides activating pulses to an RF synthesizer 120 which is part of an RF transceiver system, portions of which are enclosed by dash-line block 122. The pulse control module also supplies modulating signals to a modulator 124 which modulates the output of the RF frequency synthesizer. The modulated RF signals are applied to an RF coil assembly 126 through an RF power amplifier 128 and a transmit/receive switch 130. The RF signals are used to excite nuclear spins in a sample object (not shown) undergoing examination.

The MR signals from the excited nuclear spins are picked up by the RF coil assembly and applied through the transmit/receive switch to an RF preamplifier 132 and then to a quadrature phase detector 134 in the receiver section of the transceiver. The detected signals are digitized by A/D converter 136 and applied to computer 114 for processing in a well-known manner to, for example, reconstruct MR images of the sample.

Figure 2:
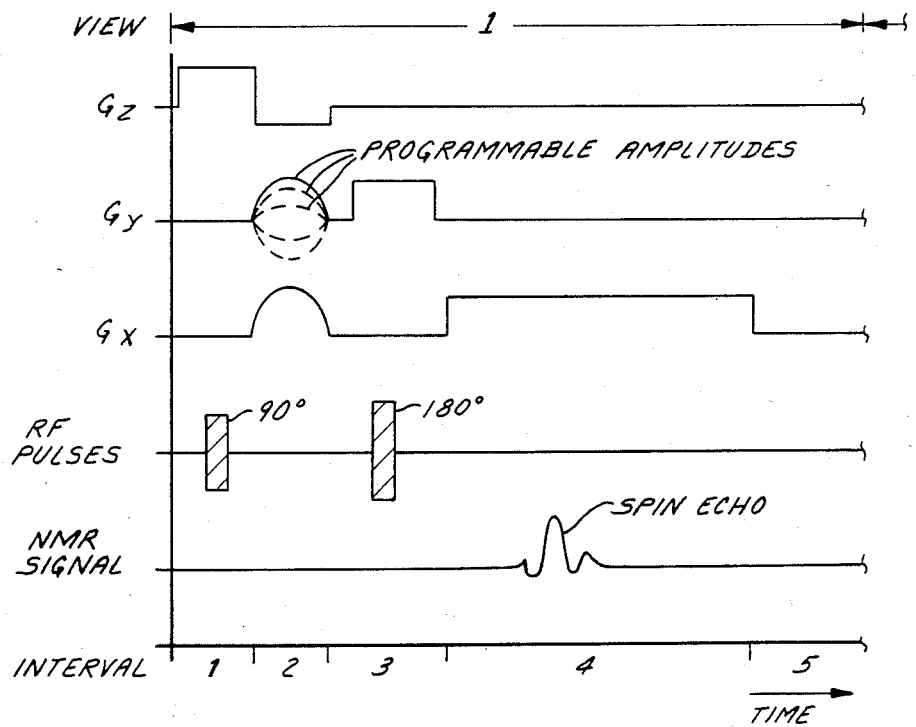
FIG. 2 depicts one exemplary view of one embodiment of a Fourier transform imaging pulse sequence, commonly referred to as spin warp, in which selective 180° RF pulses are employed for offsetting the field of view in the phase-encoding direction.

The method of the invention may be best appreciated if initial reference is made to FIG. 2 which depicts one view of an imaging pulse sequence of the type known as two-dimensional Fourier transform (2DFT) and which is frequently also referred to as two-dimensional "spin warp." This pulse sequence is useful in obtaining, in a well-known manner, imaging data to reconstruct images of a sample being investigated. This pulse sequence employs a selective 180° RF pulse to achieve an offset in the FOV in the direction of the phase-encoding gradient, as disclosed and claimed in the afore-identified patent application. A complete pulse sequence (scan) would typically consist of 128, 256 or 512 views which are substantially identical to one another, with the exception that a different amplitude of the phase-encoding magnetic field gradient pulse $G_y$ (indicated along the vertical axis) is employed in each view (assuming no averaging). As used herein, a scan is defined as a single application of the pulse sequence (for example, that of FIG. 2) in which the number of views is equal to the number of different available phase-encoding gradient amplitudes.

Th exemplary view comprising intervals 1–5 will now be described in detail with reference to FIG. 2. In interval 1, a selective 90° RF excitation pulse (typically modulated by a sinc function) is applied in the presence of a positive $G_z$ gradient pulse so as to preferentially excite nuclear spins in a predetermined region of a sample object (not shown) having precession frequencies as predicted by the Larmor equation. A negative $G_z$ pulse is applied in interval 2 to rephase nuclear spins excited in interval 1. Typically, the $G_z$ pulses are selected such that the time integral of the gradient pulse waveform over interval 2 is equal to a negative one half of the time integral of the gradient pulse over interval 1. $G_x$ and $G_y$ gradient pulses are also applied simultaneously with the $G_z$ gradient pulse in interval 2. The function of the $G_y$ gradient pulse is, as alluded to hereinabove, to encode phase information into the excited nuclear spins. The purpose of the $G_x$ gradient pulse is to dephase the excited nuclear spins by a predetermined amount to delay the occurrence of the MR spin-echo signal in interval 4. The spin echo, produced by a selective 180° RF pulse applied in interval 3 in the presence of a $G_y$ gradient pulse, is sampled in interval 4 in the presence of a linear $G_x$ readout gradient. The frequency content of the 180° RF pulse is selected so as to produce a spin echo only from a predetermined region (strip) of the selected slice. The frequency content is selected so that the strip is offset from the isocenter, thereby achieving the desired offset in the direction of the phase-encoding gradient. The selective 180° RF pulse also band limits the MR signal in the phase encoding-direction thereby eliminating or reducing aliasing.

The excitation/sampling process described hereinabove is repeated in subsequent views of the pulse sequence until the $G_y$ gradient is sequenced through its range of amplitudes (e.g., 128, 256, etc.). The MR information encoded in the MR signal by the phase encoding and the readout gradient is recovered in a well-known manner using two-dimensional Fourier transform techniques.

Figure 3:
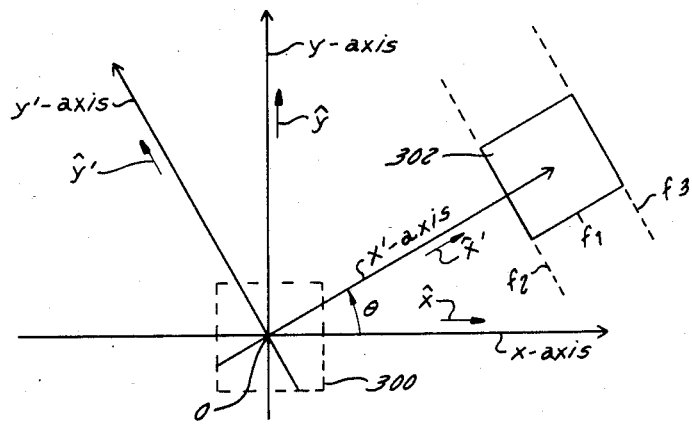
FIG. 3 illustrates the method of the invention applied to a two-dimensional spin warp imaging sequence.

The method of the invention will now be described with initial reference to FIG. 3. FIG. 3 illustrates the x- and y-axes of a Cartesian coordinate system along which the $G_y$ (phase encoding) and $G_x$ (readout) magnetic field gradients are applied. There is also shown the system isocenter "0" at which a conventional image would be centered, as suggested by the dash-line block 300. In accordance with the inventive method, these axes are rotated by a predetermined angle $\theta$. The readout and the phase-encoding axes are similarly rotated and applied along the rotated axes designated x' and y'.

Rotation of the readout gradient, pointing to the desired center of FOV (302, FIG. 3), is achieved by creating a new readout gradient by the vectorial addition of two gradient fields. Thus, if the conventional readout gradient is designated by a vector quantity $g_x\hat{x}$, where $\hat{x}$ is a unit vector along the x axis (as shown in FIG. 3) and $g_x$ is the amplitude of the gradient, the rotated vector can be expressed as $$g_x\hat{x}' = g_x \cos(\theta)\hat{x} + g_x \sin\theta\hat{y} \qquad (1)$$

where
  y is the unit vector along the original y axis,
  x' is the unit vector along the new x' axis, and
  $\theta$ is the angle between x and x'.

Figure 4:
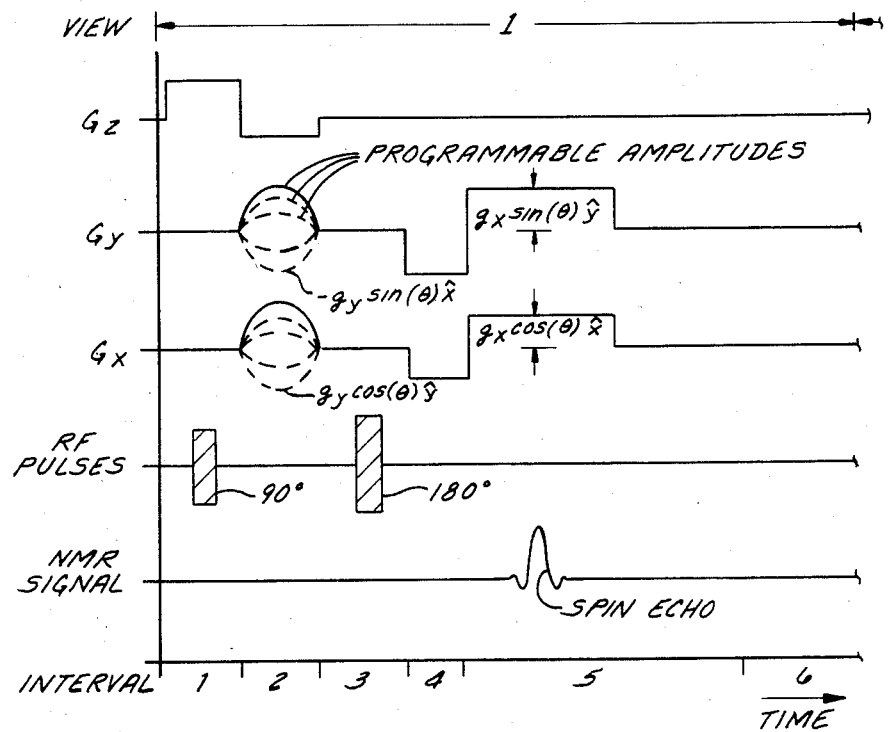
FIG. 4 depicts one view of a spin warp pulse sequence in accordance with the invention wherein the offset in the phase-encoding direction is achieved without the application of selective 180° RF pulses.

The manner in which the new readout gradient is implemented is shown in interval 5 of FIG. 4. In this case, the readout gradient, applied along the x' axis, is generated by the $G_x$ and $G_y$ orthogonal gradient coils, with amplitudes of $g_x \cos(\theta)$ and $g_y \sin(\theta)$, respectively. One metod for obtaining the offset along the readout axis is achieved by centering the receiver frequency to $f_1$, corresponding to the center frequency of the desired field of view. If desired, the MR signal can be band limited in the readout gradient direction by passing it through a bandpass filter (not shown) having cut-off frequencies $f_2$ and $f_3$ corresponding to the edges of the field of view, as shown in FIG. 3.

The negative $G_x$ and $G_y$ gradient pulses applied in interval 4 of FIG. 4 are needed for phase compensation to ensure that the nuclear spins rephase and produce a spin-echo signal in interval 5.

Associated with the new readout gradient, there is a new phase-encoding gradient directed along the y' axis in FIG. 3. The new readout gradient, in a manner similar to that of the readout gradient, is produced by the vectorial addition of two $G_x$ and $G_y$ gradient pulses applied in interval 2 of FIG. 4. The new phase-encoding gradient can be expressed as $$g_y\hat{y}' = -g_y \sin(\theta)\hat{x} + g_y \cos(\theta)\hat{y} \qquad (2)$$

where $g_y$ is the required amplitude of the phase-encoding gradient in a given view. It will be recognized that, as before, the phase-encoding gradient must be sequenced through its range of amplitudes in the course of a complete scan.

From the foregoing, it will be appreciated that an arbitrary off-center field of view can be obtained in two-dimensional Fourier transform MR imaging, as described herein by way of example with reference to a two-dimensional spin warp imaging pulse sequence, without requiring the use of selective 180° RF pulses to achieve an off-center offset in the phase-encoding direction. This permits the 180° RF pulses applied in interval 3 of FIG. 4 to be used for other functions such as multi-slice imaging.

In some imaging applications, such as small FOV or off-center FOV multi-slice imaging, image foldover or aliasing may occur when the inventive method is used because of lack of band-width limiting in the phase-encoding direction (y' axis). This problem is avoided in conventional single slice imaging because a selective 180° RF pulse can be used to produce a spin-echo signal from a narrow strip of the entire slice, as described before. This capability is not available, in multi-slice imaging applications, since the 180° is used for slice selection. The inventive method, however, finds an important application in two-dimensional multi-slice off-center FOV imaging using surface coils. In this case, the region of the object imaged is highly localized substantially to the object area subtended by the surface coil. The image can be displayed in the area of the FOV free of foldover or aliasing artifacts. Such images are highly useful for localized studies of specific anatomic features such as heart, liver, shoulders and hips which are displaced from the isocenter.

While this invention has been described with reference to particular embodiments and examples, other modifications and variations will occur to those skilled in the art in view of the above teachings. Accordingly, it should be understood that within the scope of the appended claims the invention may be practiced otherwise than is specifically described.

The invention claimed is:

1. A method for imaging, using MR, a predetermined region of an object, which region is removed from the isocenter of an MR system having gradient coils for generating magnetic field gradients along the x, y and z axes of a Cartesian coordinate system, said MR system having RF means for exciting and receiving MR signals from said region, said method comprising the steps of:
   (a) exciting nuclear spins in said region;
   (b) applying a phase-encoding gradient having one of a plurality of predetermined amplitudes to phase encode spatial information into said excited nuclear spins, said phase-encoding gradient being applied along a y' axis rotated by an angle $\theta$ relative to the y axis;
   (c) receiving an MR signal from said excited spins in the presence of a readout magnetic field gradient applied along an X' axis which is orthogonal to said y' axis, said angle $\theta$ being greater than zero and selected such that said x' axis intersects said predetermined region; and
   (d) repeating said steps (a)–(c) so as to sequence through each of said plurality of predetermined amplitudes.

2. The method of claim 1 wherein said phase-encoding gradient is defined by $$g_y\hat{y}' = -g_y \sin(\theta)\hat{x} + g_y \cos(\theta)\hat{y}$$

and wherein said readout gradient is defined by $$g_x\hat{x}' = g_x \cos(\theta)\hat{x} + g_x \sin(\theta)\hat{y}$$

where
  $g_y$ is one of said predetermined amplitudes of said phase-encoding magnetic field gradient;
  $g_x$ is the amplitude of said readout magnetic field gradient;
  $\hat{x}$ and $\hat{y}$ are unit vectors directed along the x and y axes, respectively; and
  x' and y' are unit vectors directed along the x' and y' axes, respectively.

* * * * *